United States Patent [19]

Braginski et al.

[11] 4,038,541

[45] July 26, 1977

[54] HARD MAGNETIC BUBBLE DOMAIN ANALOG MULTIPLIER

[75] Inventors: Aleksander I. Braginski, Plum Borough; Terence W. O'Keeffe, Pittsburgh, both of Pa.

[73] Assignee: Westinghouse Electric Corporation, Pittsburgh, Pa.

[21] Appl. No.: 674,512

[22] Filed: Apr. 7, 1976

[51] Int. Cl.[2] .......................... G06G 7/16; G11C 11/14

[52] U.S. Cl. .......................................... 235/194; 324/142; 340/174 TF

[58] Field of Search ............... 235/194, 193, 195, 196, 235/156, 152; 324/142; 340/174 TF, 174 R, 174 HA, 174 EB, 174 SR; 307/88 LC

[56] References Cited

U.S. PATENT DOCUMENTS

| | | | |
|---|---|---|---|
| 3,812,480 | 5/1974 | Kish et al. | 340/174 TF |
| 3,825,910 | 7/1974 | Carr, Jr. et al. | 340/174 TF |
| 3,845,478 | 10/1974 | Carr, Jr. | 340/174 TF |
| 3,894,223 | 7/1975 | Majima et al. | 235/156 X |
| 3,895,363 | 7/1975 | Braginski et al. | 340/174 TF |

*Primary Examiner*—Joseph F. Ruggiero
*Attorney, Agent, or Firm*—R. W. Smith

[57] ABSTRACT

Hard magnetic bubble domains are propagated in displaced orbits in response to the product of two cyclically varying propagation control fields. The control fields modulate the hard bubble domain diameter and a driving field gradient. Repulsive boundaries establish a restricted propagating channel in a layer of bubble domain material to maintain the net displacement of orbital movements of the bubble domain along a predetermined axis. The axis of the bubble domain net displacement is perpendicular to the direction of the driving field gradient and preferably along a neutral axis of the driving field gradient. The net displacement of the hard bubble domains provide an improved analog multiplication of two alternating current computational input signals controlling the propagation control fields.

13 Claims, 5 Drawing Figures

HARD MAGNETIC BUBBLE DOMAIN ANALOG MULTIPLIER

CROSS-REFERENCE TO RELATED PATENTS

This application is related to U.S. Pat. No. 3,845,478, issued Oct. 29, 1974, assigned to the assignee of this invention.

BACKGROUND OF THE INVENTION

This invention relates to a hard magnetic bubble domain analog multiplier having an improved linear response of bubble domain propagating velocities produced by the product of two propagation control magnetic fields. More particularly, the invention relates to a hard magnetic bubble domain analog multiplier having repulsive boundaries defining a propagating channel perpendicular to the direction of a driving field gradient established by one of the two control fields.

Prior magnetic domain analog computational arrangements are known utilizing drive control magnetic fields for propagating single wall magnetic domains or bubble domains with predetermined responses. The velocity and direction of bubble domains are controlled in a domain multiplier computational arrangement by the combined response to at least two drive control fields. Computational inputs are formed by electrical signals related to quantities to be computed upon. These electrical input signals control or produce the drive control magnetic fields directed into a predetermined magnetic bubble domain propagating path or channel. Examples of analog bubble domain computational arrangements are disclosed in the above cross-referenced Pat. No. 3,845,478 and also in U.S. Pat. No. 3,825,910 issued July 23, 1974 also assigned to the assignee of this invention.

Magnetic bubble domains are propagated in accordance with the disclosure of U.S. Pat. No. 3,825,910 by a self-induced magnetic drive field established when a bubble domain is moved above a semiconductor drive layer having a uniform current density. Various analog computational arrangements are described in the aforementioned patent with a bubble domain being propagated by a field carried with the domain. In one arrangement, an additional control magnetic field is applied to a predetermined propagating channel so that the velocity of the magnetic bubble domain is proportional to the product of the controlled magnetic field and the level of the uniform current density layer producing the induced field. In the latter arrangement, the net displacement of the bubble domain produces a computational output proportional to the product of two quantities controlling the control magnetic field and the uniform drive layer current. Some limitations are found in the device just described in the difficulty of obtaining semiconductor materials having proper Hall effect characteristics. The complex interactions of magnetic fields including those including the Hall effect field interactions produce some difficulty in controlling the resultant bubble domain movement. It is noted that the basic mode of propagating bubble domains in the above-described device differs from that of the present invention.

The present invention is more directly related to and is an improvement of the bubble domain computational arrangement disclosed in the above cross-referenced U.S. Pat. No. 3,845,478. The arrangement disclosed propagates magnetic bubble domains in response to the product of two drive control magnetic fields controlled by two alternating current input signals. The first drive control field is effective to modulate the bubble domain size or diameter and the second drive control field produces a modulated field gradient applied across the bubble domain. Bubble domains are driven at an average velocity associated with a net displacement proportional to the product of the variations in the domain size and the level of the field gradient. Input signals, proportional to voltage and current components of an electric power consumption quantity to be computed, are effective to separately control the first and second drive control fields. The net velocity of the magnetic bubble domain is a computed measurement of electric power. Accordingly, the detected displacement of the magnetic bubble domain provides an indication of the time integral of the multiplied voltage and current quantities and thus a computed measure of electrical energy.

The direction of the magnetic bubble domain net displacement in the U.S. Pat. No. 3,845,478 is along the direction of the controlled magnetic field gradient with the magnetic bubble domains being soft or normal magnetic bubble domains. The described propagated movement is oscillatory with reciprocating motion rather than with a cyclical orbital motion produced in the present invention. It has been observed that in the operation of the propagating device of the aforementioned patent, the controlled field gradient may produce substantial modulation of the magnetic bubble domain diameter in addition to the variations in the bubble domain diameter produced by the size modulating field. Since the domain size is directly interrelated to associated driving field gradient, the dynamic range of input signals is sometimes limited. Undesirably, the magnetic bubble domain is propagated so that its velocity is not directly related to the product of the two drive control fields. This occurs since the two fields do not independently modulate the domain diameter and field gradient. The domain diameter variations due to the controlled field gradient are referred to as a self-multiplication effect of the magnetic bubble. Accordingly, it is desirable to avoid self-multiplication, drift components in the net bubble domain displacement, and other effects producing non-linear response in a magnetic bubble domain analog multiplier device and especially those effects causing unacceptable mixing of the two drive control field contributions to domain computational movement. To improve these undesired effects, the present invention utilizes the propagating characteristics of hard magnetic domains having what is believed a more complex magnetically defined wall structure to provide an oscillatory cyclical motion that produces a net displacement more linearly responsive to the product of two propagating control fields.

SUMMARY OF THE INVENTION

In accordance with the present invention, a hard magnetic bubble domain analog multiplier includes an elongated strip layer of bubble domain material having a propagating channel defined by substantially parallel repulsive boundaries extending between the strip ends. A bias field establishes a hard magnetic bubble domain in the channel. Two propagation control fields are applied into the channel such that a first and domain diameter control field modulates the bias field in response to a first alternating current input signal related to a first quantity to be computed upon. A second control field effects a driving field gradient in a direction across the width of the channel. The driving field gradient is varied in response to a second alternating current input signal. The latter input signal is related to a second quantity to be computed upon by being multiplied by the first quantity. The two propagation control fields are cyclically varying to propagate the hard magnetic bubble domains in orbital paths so as to have a net displacement along a predetermined axis. The measured net displacement or time for a predetermined net displacement distance is an indication of a computed time integral of the product of the two quantities to be computed upon. The repulsive boundaries restrict the hard bubble domain orbital travel that is transverse to the predetermined axis of net displacement as the bubble domain moves in controlled orbits having substantially equal and opposite transverse displacement components and a net longitudinal displacement component along the channel axis. The resulting net displacement is proportional to the product of the magnitudes and the phase angle between the two alternating current computational input signals. Net displacement of the magnetic bubble domains is sensed by domain detectors.

It is a general feature of this invention to provide an improved hard magnetic bubble domain analog multiplier for multiplication of two alternating current signals. In a preferred form of this invention, a channel is formed by repulsive boundaries adjacent the narrow parallel edges of a strip of domain material extending transversely to a driving field gradient. The channel contains the driven orbital excursions of hard bubble domains produced by the field gradient and the domain diameter control field. It is a further feature of this invention to produce channel boundaries by repulsion magnetic field sources which are effective to repel the transverse movement in the bubble domain orbital trajectory that is directed away from a predetermined longitudinal axis of measured bubble domain net displacement. A still further feature of this invention is to effect net displacement of cyclical and orbital hard bubble domain motion along a neutral axis of a driving field gradient to reduce propagation errors in an analog multiplier. In a bubble domain analog multiplier having a strip layer of hard bubble domain material and an adjacent ribbon of conductive material carrying a uniform current density so as to produce a driving field gradient having a neutral field axis, the side edges of the domain material are disposed equidistant from the neutral field axis so that the repulsive boundaries maintain the bubble domain net displacement along the neutral axis. A still further feature of this invention is to provide a hard bubble domain analog multiplier wherein a driving field gradient source is formed by spaced current carrying conductors having current flow in predetermined directions to generate a field gradient having a centrally disposed neutral axis relative to repulsive boundaries extending perpendicular to the direction of the gradient field.

Other features and advantages of this invention will be apparent from the description of the preferred embodiments of the invention shown in the drawings.

DETAILED DESCRIPTION OF THE PREFERRED EMBODIMENTS

Figure 1:
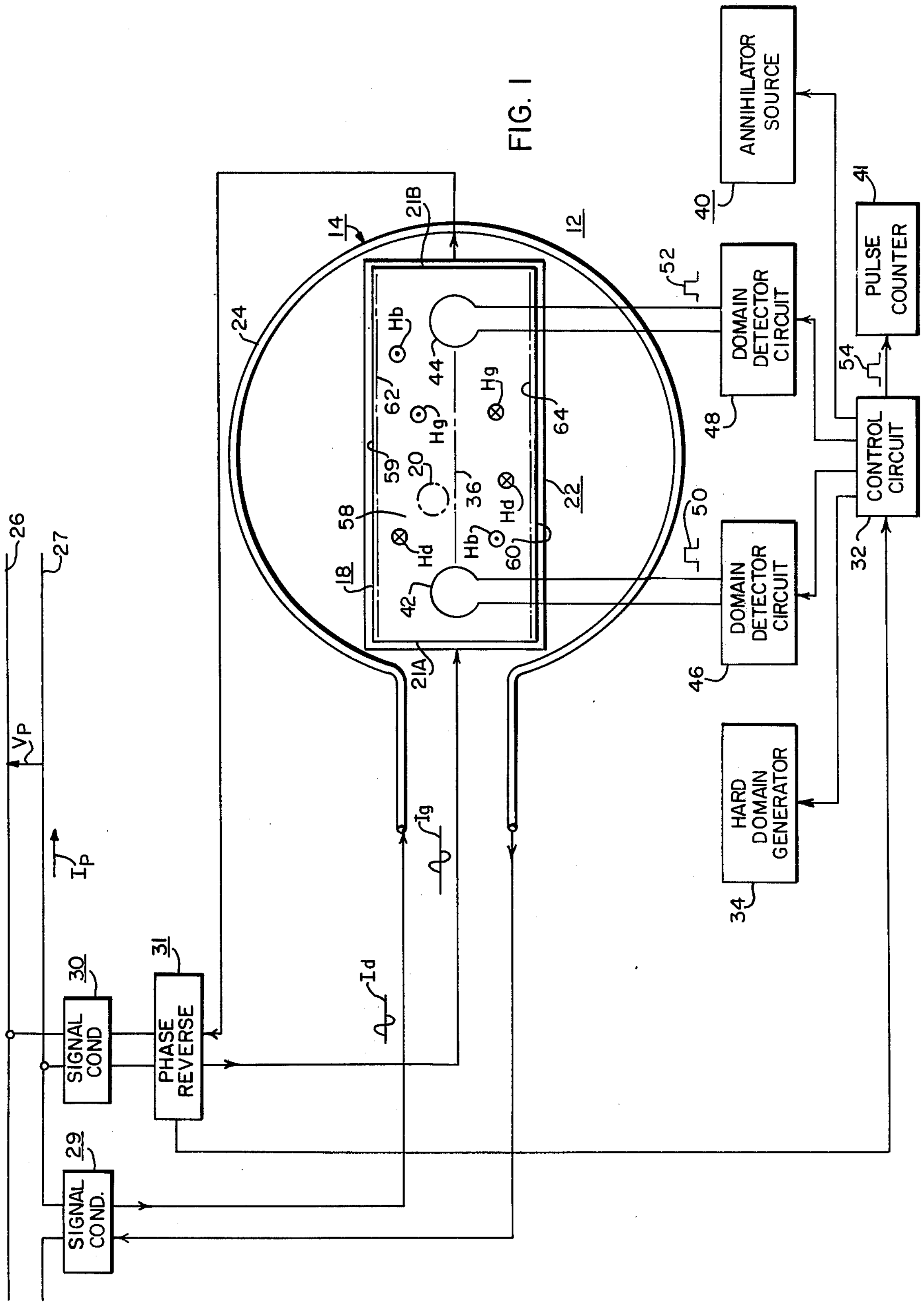
FIG. 1 illustrates a computating system including a hard magnetic bubble domain analog multiplier made in accordance with this invention.

Referring now to FIG. 1 of the drawings, a magnetic bubble domain computing system 12 is illustrated including a hard magnetic bubble domain analog multiplier 14 which is made in accordance with the present invention. The multiplier 14 includes a strip layer 18 of magnetic bubble domain material of a type capable of having a hard magnetic bubble domain 20 established and moved therein. The multiplier 14 is an improvement of the magnetic bubble domain propagating device disclosed in U.S. Pat. No. 3,845,478, issued Oct. 29, 1974 and issued to the assignee of this invention. Both the device of the aforementioned patent and the multiplier 14 move or propagate a magnetic bubble domain at a velocity directly related to variations in the bubble domain diameter and the modulated strength of a magnetic field gradient produced across the bubble domain diameter. As explained more fully herein below, the characteristics of the bubble domains and domain propagation relative to the field gradient differ in the present invention.

The hard magnetic bubble domain 20 is moved in the strip layer 18 in response to first and second cyclically varying drive or propagation control fields Hd and Hg directed perpendicularly through the plane of the strip layer 18. The propagation control field Hd is effective to vary the bubble domain diameter hereinafter referred to as the domain diameter control field and the propagation control field Hg is effective to produce a driving magnetic field gradient across the bubble domain diameter and is referred to hereinafter as the driving field gradient. As described more fully in connection with the description of FIGS. 2 and 4, the magnetic bubble domain 20 is movable toward either end 21A or 21B of the strip layer 18 at a net or average velocity related to the product of the control fields Hd and Hg. Thus, the desired net domain propagation if perpendicular to the direction of the driving field gradient rather than along the direction of the gradient control field as disclosed in the aforementioned U.S. Pat. No. 3,845,478.

The hard bubble domain 20 is a type of single wall magnetic domain having a substantially cylindrical bubble configuration wherein the direction of magnetization within the bubble domain is opposite to the direction of magnetization of the material of the strip 18 as it is in a normal or soft bubble domain. It has been observed that some bubble domains have different mobility and direction of movement characteristics. It is believed that these differences are distinguished by characterizing the bubble domains as being normal or soft bubble domains or hard bubble domains as is the bubble domain 20. These differences are explained by differences in the magnetic structure of cylindrical walls of the bubble domains which have a finite thickness. The cylindrical walls separate the opposite directions of magnetization inside and outside of the bubble domain with the opposite directions being perpendicular to the top and bottom surfaces of layer 18. Hard bubble domain generation is achieved using principles and methods described in a paper "Extraordinary Bubbles In Epitaxial Garnet Films" by H. Nishida, T. Kobayashi and Y. Sugita; A.I.P. Conference Proceedings No. 10, Part 1 (Magnetism and Magnetic Materials - 1972), pages 493–497, American Institute of Physics, N.Y. 1973.

One different characteristic of hard bubble domains is the direction of domain propagation in response to the direction of a magnetic field gradient applied across the domain diameter. Hard bubble domain motion is at an angle to the direction of the driving field gradient rather than parallel to the field gradient as described in the U.S. Pat. No. 3,845,478. It is to be understood that the direction of a field gradient is the direction in which the rate of change in the intensity or strength of the magnetic field gradient is greatest, keeping in mind that the driving field gradient is oscillatory. In the bubble domain propagating device disclosed in the aforementioned U.S. Pat. No. 3,845,478, a desired bubble domain motion is described for a normal or soft bubble domain which has motion which is along or parallel to the direction of the field gradient exerted thereacross, as noted above. The present invention advantageously utilizes the characteristics of hard bubble domains in which the cyclical orbiting bubble domain movement has a net displacement in a direction perpendicular to the direction of the magnetic field gradient as described further hereinbelow.

To produce the driving field gradient Hg, forming one propagation control field, the domain analog multiplier 14 has associated therewith a ribbon layer 22 of conductive material, in one preferred embodiment. The layer 22 may have different length and width dimensions than the layer 18. An A.C. input current signal Ig is applied through the ribbon layer 22 so as to have a uniform current density throughout the ribbon layer which has a thin uniform thickness. The current signal Ig in the ribbon layer 22 generates the control field Hg described further hereinbelow. To produce the domain diameter control field Hd, forming the other propagation control field, a conductor loop 24 is formed in a parallel plane relationship above the strip layer 18. The A.C. input current signal Id is applied to the conductor loop 24. The current Id generates the magnetic field Hd uniformly and in a perpendicular direction into the plane of the strip 18 where the bubble domain 20 is to be moved. Accordingly, the input current signals Id and Ig form first and second computational input signals, respectively, for generating the two propagation control fields being related to first and second quantities to be multiplied together in operation of the multiplier 14.

Before describing in detail the operation of the bubble domain analog multiplier 14 and the response of the bubble domain 20 to the associated magnetic fields, the magnetic bubble domain computating system 12 is now generally described as an example of one typical use of the bubble domain analog multiplier 14 made in accordance with this invention. The computating system 12 is arranged to measure the electrical energy supplied through the conductors 26 and 27. An A.C. voltage quantity Vp and an A.C. current quantity Ip define the components of electrical power occurring in the conductors 26 and 27. It is well known that the electrical energy carried in the conductors 26 and 27 and measured in kilowatt hours is equal to the time integral of the power flow in these conductors.

Signal conditioning circuits 29 and 30 develop the A.C. input current signals Ig and Id respectively, so that they are directly related, for example, in magnitude and phase, to the voltage and current quantities VP and Ip. The levels of the input signals are controlled by the signal conditioning circuits 29 and 30 to be appropriate for producing the related magnetic bubble domain driving characteristics of the propagation control fields Hd and Hg. A phase reverser circuit 31 is connected between the signal conditioning circuit 30 and the ribbon layer 22 to selectively reverse or shift the phase angle of the current signal Ig one hundred eighty degrees for purposes described in detail hereinbelow.

For the computating system 12 to initiate and synchronize magnetic bubble domain propagations for the desired analog computational operation, a control circuit 32 is provided. A bias field is provided by a permanent magnet, not shown, which produces the constant D.C. bias field Hb. A hard magnetic bubble domain generator 34 is controlled by the control circuit 32 to develop a hard magnetic bubble domain 20 preferably adjacent one end of the strip layer 18 and along a predetermined axis 36 of the strip layer 18. The axis 36 extends longitudinally between the ends 21A and 21B of strip layer 18 as a reference path for net displacement in the domain orbital travel between the ends 21A and 21B. The bubble domain 20 may progress in opposite directions in the strip layer 18 and along the axis 36 when the differences in phase relationship between the alternating current input signals Id and Ig is reversed. The control circuit 32 controls the phase reverser circuit 31 to effect reversal of the direction of the domain net displacement. An optionally provided bubble annihilator source 40 is also controlled by the control circuit 32 so that when the magnetic bubble domains have traversed to the ends of the strip layer 18 they can be eliminated and a new domain can be generated when the reversing operation is not desired. Successive domains are moved in a common direction of net displacement in the latter mode of operation. A computational output circuit formed by a pulse counter 41 provides an indication of measured electrical energy as described more fully hereinbelow.

A pair of bubble domain detectors 42 and 44, which may be of a known type utilizing magnetoresistive, Halleffect or like devices, are effective to generate a signal across output conductors connected to the domain detector circuits 46 and 48, respectively in response to the magnetic field associated with a bubble domain passing thereunder. The detectors 42 and 44 are positioned adjacent the ends 21A and 21B at opposite ends of the axis 36. The detector signals are applied as pulses 50 and 52 to the circuit 32 upon originating from the detectors 42 and 44. The pulses 50 and 52 are effective to produce pulses 54 from the circuit 32 to the pulse counter 41. The output pulses 54 are proportional to the time between the instant the bubble domain 20 is generated under one of the domain detectors 42 or 44 and the instant it reaches the other one of the detectors. The time between the pulses 54 provides an indication of the elapsed time that a bubble domain 20 is moved under control of the propagation control fields Hd and Hg along the axis 36 between positions beneath first one of the detectors 42 and 44 and then the other. Upon reaching a detector, the pulses 50 or 52 are effective to operate the phase receiver circuit 31 and reverse the domain travel. Alternatively, one of the pulses 50 or 52 can activate the annihilator 40 and the domain generator 34 to repeat domain travel in the same direction.

The domain analog multiplier 14 moves the bubble 20 in cyclical orbits with a net displacement along the axis 36 at an average velocity proportional to the product of the propagation control fields Hg and Hd. Domain propagation is in a channel 58 of the layer 18 extending substantially parallel to the axis 36 and the side edges 59 and 60 of the strip layer 18. The channel 58 has side repulsive boundaries 62 and 64 extending between the opposite ends 21A and 21B of the strip layer 18 where the detectors 42 and 44 are positioned. The repulsive boundaries 62 and 64 are formed substantially equidistant from the axis 36 of the layer 18 and are immediately adjacent the edges 59 and 60. The side edges are effective to form the boundaries 62 and 64 as described more fully hereinbelow in connection with the detailed description of the magnetic fields associated with the hard bubble multiplier 14 hereinafter and more particularly in accordance with the description of FIG. 3.

Figure 2:
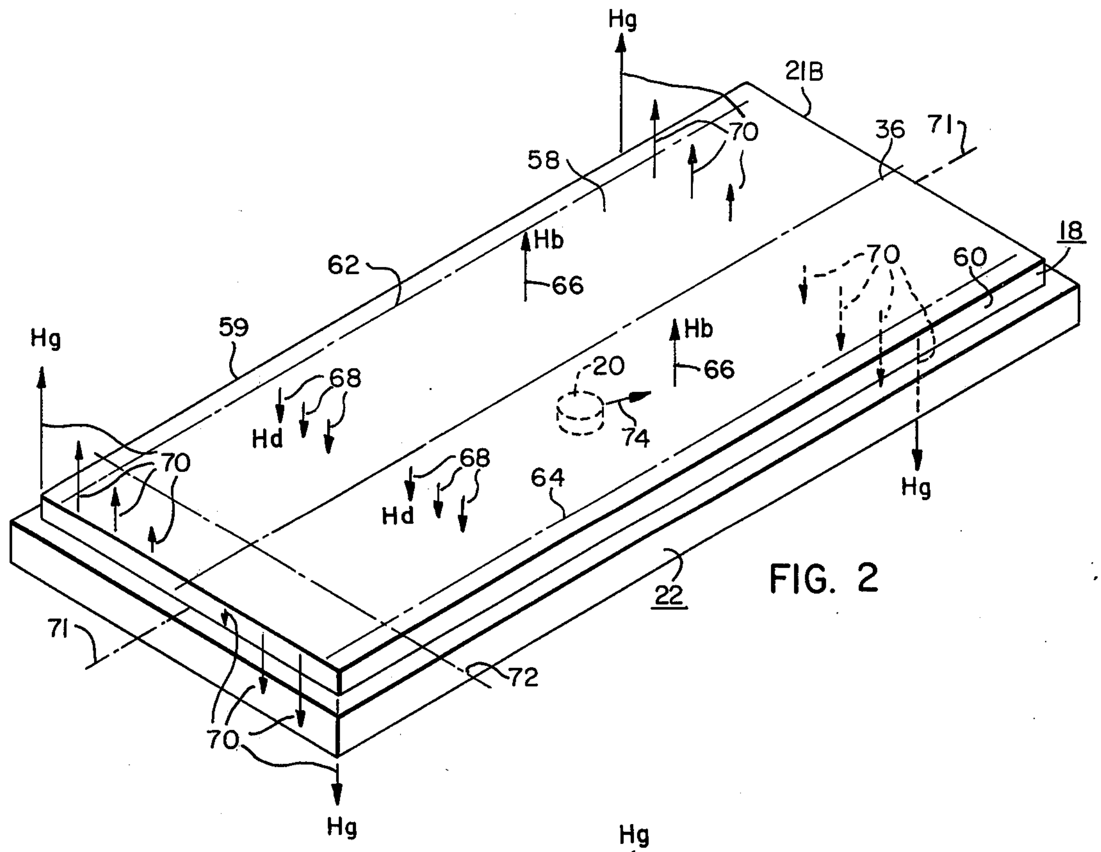
FIG. 2 is an enlarged perspective view of the hard magnetic bubble domain analog multiplier illustrated in FIG. 1.

FIG. 2 illustrates an enlarged perspective view of the multiplier 14 shown in FIG. 1 for purposes of illustrating the magnetic fields associated therewith. The bias field Hb established by steady D.C. field maintains an average or optimum hard magnetic bubble domain size and diameter and is represented in FIG. 2 by the directional arrows 66 directed by the bias magnet perpendicular to the flat top and bottom surfaces of the strip layer 18. As is understood by those skilled in the art, the direction of magnetization of the hard bubble domain 20 is downward to be opposite to the direction of magnetization of the remaining portion of the strip layer 18 and to the bias field Hb. The bias field Hb is constant with time and uniform in space throughout the area of the strip layer 18.

The input current signal Id is taken as having a sinusoidal waveform by way of illustration and not limitation in this invention to produce a sinusoidally cyclically varying domain diameter control field Hd. The directional arrows 68 indicate the direction of the control field Hd at one instant of time. The field Hd varies between maximum magnitudes in opposite directions in a sinusoidally varying manner uniformly so as to be time varying in accordance with the frequency of the input signal Id. Also, the loop 24 produces the field Hd so that it is uniform in space at any given instant through the area of the strip layer 18. The control field Hd effectively modulates the bias field Hb to modulate the diameter of the hard bubble domain 20. When the field Hd is in the direction of the directional arrows 68 in FIG. 2 and opposite to the bias field Hb, the magnetic bubble 20 is enlarged from its average or neutral diameter, which is when the control field Hd is zero. Accordingly, when the direction of the control field Hd is reversed from that shown in FIG, 2, the bubble domain diameter is smaller than that of its neutral diameter.

The driving field gradient Hg is represented at one instant of time by the directional arrows 70. The field Hg is generated by the uniform current flow of the input current Ig flowing in the ribbon layer 22. Due to the width of the ribbon 22 and the current flow parallel to the sides of the strip and therefore parallel to the channel 58, there is a neutral magnetic field axis 71 substantially coinciding and aligned with the center of the layer 18 and axis 36 along which the vertically directed magnetic field Hg generated by the current Ig is substantially zero. There are substantial magnetic fields generated that are horizontal and parallel to the plane of the layer 18 but these horizontal fields do not produce propagating forces on the bubble domain 20. The intensity of the field Hg progressively increases, vertically to the plane of the layer 18, from the axis 36 to the side edges of the strip 18 in opposite directions. As viewed in FIG. 2, the directional arrows 70 are perpendicular to the top and bottom surfaces of the strip layer 18 and upward to the left-hand side of the axis 36 and downward along the right-hand side of the axis 36. The gradient direction of the field gradient Hg is then along the axis 72 in the plane of the strip layer 18 and perpendicular to the axis 36 and also perpendicular to the side boundaries of the channel 58.

The input current Ig has a sinusoidally cyclically varying waveform, by way of example, so that the field Hg varies in time between maximum magnitudes in opposite directions. Accordingly, at another instant of time, for example one hundred eighty electrical degrees in the cycle of the current signal Ig, the directional arrow 70 would be downward and upward along the left-hand and right-hand sides, respectively, of the axis 36. It is to be noted that the phase relationship between the control fields Hg and Hd varies in accordance with the phase relationship between the input signals Ib and Ig. The latter phase relationship is directly related to the phase relationship between the voltage and current quantities Vp and Ip and, therefore, the power factor of the electric energy flow in the conductors 26 and 27 which is to be measured by the multiplier 14 of this invention. For purposes of describing this invention, the input current signals are taken as being in phase or one hundred eighty degrees difference upon operation of the phase reverser circuit 31.

The hard magnetic bubble 20 is propagated at a net velocity proportional to the product the domain diameter control field Hd and the driving field gradient Hg with a net displacement along the axis 36. It is noted in the aforementioned U.S. Pat. No. 3,845,478 that net bubble domain velocity is controlled by the combined effects of the magnetic bubble domain diameter and the gradient of the magnetic field across the diameter with net displacement in the direction of the field gradient. Translational travel of the hard bubble domain 20 is at an angle to the direction of the field gradient Hg, indicated by the directional arrow 74 rather than substantially along the axis 72 and in the direction of the field gradient as in the case of a simple or normal magnetic bubble as disclosed in the U.S. Pat. No. 3,845,478. The orbital hard bubble motion effected by the cyclic magnetic fields is described hereinafter.

Figure 4:
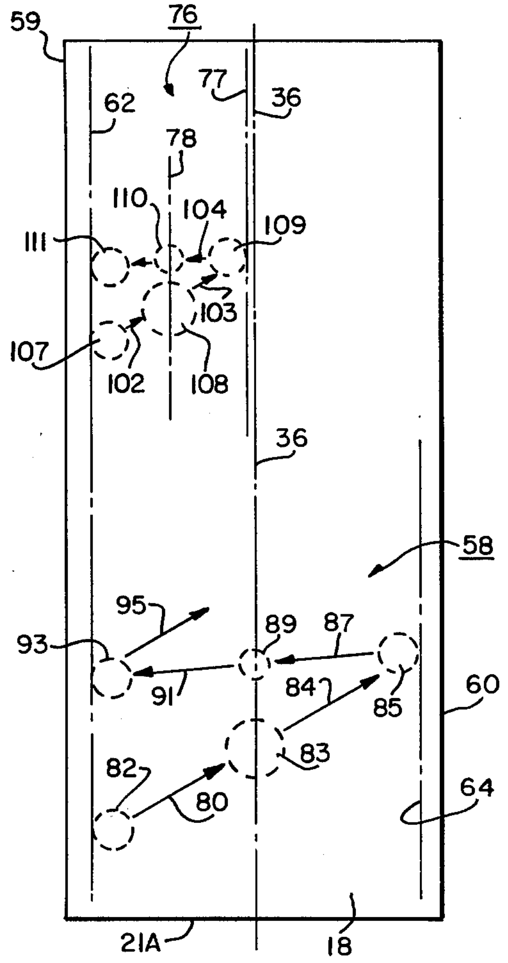
FIG. 4 is a top schematic view of the bubble domain propagating device for purposes of illustrating different operative conditions of the device.

FIG. 4 illustrates two different modes of propagating a hard magnetic domain in accordance with the present invention. The lower portion of the strip layer 18 illustrates the preferable mode wherein the net displacement is along the axis 36 in the channel 58 having repulsive boundaries 62 and 64, as shown in FIGS. 1 and 2. As noted above, the field gradient neutral axis is coincident to the axis 36 such that there is zero strength of the field Hg along the axis 36. In the upper portion of FIG. 4, boundary 62 immediately adjacent to the side 59 of the strip layer 18 is one boundary of a channel 76 and an opposite boundary 77 is associated with the immediately adjacent axis 36 so that net domain displacement is along a mutual parallel axis 78.

Directional arrows in FIG. 4 indicate the trajectory of orbital movements of a hard bubble domain at various translational positions when the domain diameter and driving gradient propagation control fields are oscillating through the sinusoidally cyclic variations. With the directions of the two control fields as shown in FIGS. 1 and 2, the directional arrow 80 shows the movement from an initial hard bubble domain position 82 to a second bubble position 83. The bubble domain diameter at the position 82 is smaller than that of the position 83 on the axis 36 since the bubble domain position 82 is adjacent the repulsive boundary 62 and has a neutral size established by the D.C. bias field Hb when the field Hd is passing through zero. There is essentially zero domain velocity at the domain position 82 which at the maximum left-hand transverse position when field gradient is also passing through zero strength. It is noted that this repulsive boundary 62 magnetically opposes the hard bubble domain as described more fully in connection with the description of FIG. 3. The hard bubble domain moves in the field gradient with motion toward lower bias fields and generally at an angle to the direction (along the axis 72) of field gradient. Increased hardness characteristics of a hard bubble domain results in motion more perpendicular or transverse to the direction of the field gradient. During the instant when the driving field gradient Hg at the left-hand side of the axis 36 and is out of the plane of the strip layer 18, the gradient field decreases in strength toward the axis 36 and produces a force moving the bubble at an angle to the direction of the gradient field and along the arrow 80. As noted hereinabove, there is more tendency of harder bubble domains to move perpendicular to the field gradient, therefore the angle of the directional arrow 80 will be more parallel to the axis 36 and perpendicular to the direction of the driving field gradient. Concurrently, the direction of the domain diameter control field Hd is into the plane of the strip layer 18, the bubble domain diameter is increasing so that the propagating force increases due to the larger domain diameter. As the control fields Hg and Hd reach a maximum at the first ninety degree quadrant of their sinusoidal cycle, the field Hd has maximum opposition to the bias field Hb so that the domain diameter is maximum and the domain velocity is highest toward the right at the position 83.

The directional arrow 84 indicates the movement of the magnetic bubble domain from the position indicated at 83 to the position indicated at 85. The magnetic bubble domain approaches the right-hand repulsive boundary 64 at the side 60 of the strip layer 18 at position 85. It is noted that the bubble domain diameter becomes smaller since the field Hd decreases toward zero during the second ninety degree quadrant and the D.C. bias field strength is opposed less. Although the intensity of the driving field gradient Hg at a given instant, will be greatest at the right-hand edge 60 of the strip 18 as indicated by the length of the arrows in FIG. 2, to produce a domain velocity at an angle to the right, the strength of the control field Hg decreases to zero during the second ninety degree quadrant. Thus, at the position 83 the domain diameter returns to the neutral size and the velocity to the right is zero. At the maximum right-hand displacement of position 83 the domain also has progressed along the axis 36 or in a forward direction toward the end 21B. Further drift of the domain is opposed by repulsive boundary 64, as described further in connection with the description of FIG. 3, however, the propagating forces are negligible since the gradient is at zero strength.

Figure 3:
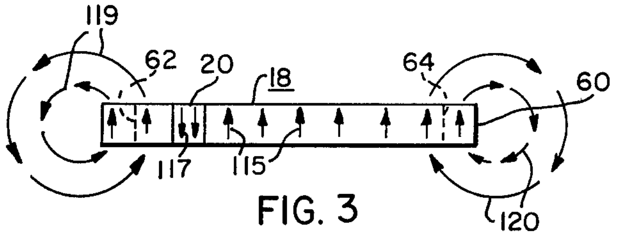
FIG. 3 is a diagrammatic end view of the strip layer of magnetic material shown in FIGS. 2 and 3 for purposes of explanation of the effect of the side edges in producing repulsive channel boundaries.

Upon phase reversal of the input signals Ig and Id and, therefore, the field gradient Hg and the diameter control field Hd, have the reverse directions from those indicated by the arrows 68 and 70 shown in FIG. 3. This occurs during the third ninety degrees quadrant of field oscillations. The directional arrow 87 indicates the path of the bubble domain from the position 85 leftward toward the position 89 at the axis 36. The domain diameter control field Hd decreases the diameter of the magnetic bubble domain since it increases strength in the direction of the bias field Hb. The field gradient Hg effects movement of the bubble domain backward toward the end 21A and toward the left at an angle to the direction of the gradient control field coming out of the plane on the strip layer 18. The velocity reaches a maximum in the leftward direction at the position 89, however, the velocity is less than during the propagation indicated by the arrow 84 because of the smaller diameter of the domain. As the magnetic bubble domain moves to the position 89 it assumes the smallest diameter during its orbital motion. The slower domain velocity accounts for the less acute angle of the leftward movement of the domain along the arrow 87.

In the fourth quadrant of the cycle of the oscillations of the propagation control fields Hd and Hg, the domain moves along the path indicated by the directional arrow 91 to the position 93 adjacent the repulsive boundary 62. The strengths of the fields are decreasing to zero. Therefore, the diameter of the magnetic bubble domain becomes larger and again reaches its neutral size and the velocity is reduced to zero. Upon phase reversal of the field gradient and domain diameter control fields, the direction of the fields are again as shown in FIG. 3 and the hard magnetic bubble domain starts a new orbital propagation cycle along the directional arrow 95 which is displaced from the corresponding directional arrow 80 by the amount of net displacement parallel to the axis 36. This net displacement produced by the complete orbit described is at a net velocity proportional to the product of the fields Hg and Hd. The domain then continues in an orbiting trajectory progressing with a net displacement along the propagating axis 36. The net displacement along the axis 37, for example between the positions 82 and 93, is a length of net movement which is proportional to the time integral of the product of the domain diameter control field Hd and the driving field gradient Hg.

In the computating system 12, the time required for a domain to travel the predetermined distance between detectors 42 and 44 along the axis 36 is indicated by a detector pulse. The detector pulses 50 and 52 are then proportional to the time integral of the product of the two drive control fields Hd and Hg and the associated input signals. Effectively, each pulse 50 and 52 produced in response to the net displacement of a domain traveling from one detector to the other is representative of a predetermined amount of electrical energy flow in the conductors 26 and 27. Thus, the pulse counter 41 forms a computational output circuit where the pulses 54 are indicative of electrical energy flow in kilowatt hours.

The upper portion of FIG. 4, within the strip layer 18 shows an alternative mode of propagating a hard magnetic bubble domain wherein the propagating channel 76 is formed between the repulsive boundary 62 adjacent the side edge 59 of the strip layer 18, as described hereinabove, and the boundary 77 adjacent the axis 36 which is coincident with neutral center axis of the field gradient Hg and has found to form a repulsive boundary under carefully controlled field conditions. The directional arrows 102, 103, 104 and 105 indicate one orbit of progressive propagation of a hard magnetic bubble domain between positions 107, 108, 109, 110 and 111. The arrows between the magnetic bubble domain positions 107, 108, 109, 110 and 111 are similar to the description for the above-described propagation of the bubble domain beginning with the directional arrow 80 and ending with the directional arrow 91. The magnetic bubble domain is propagated with a net displacement along the axis 78.

The net propagation axis 78 is parallel to the neutral axis of the driving field gradient Hg and the position of the axis is dependent upon the spacing between the center axis 36 and the side edge 50. By careful control of the strength of Hg, the spacing must be large enough not to force the bubble domain over the axis 36 and small enough not to allow the bubble net motion to drift such that bias field change due to the field gradient will exceed stability limits. It has been observed that the propagation incurs different amounts of the above-mentioned self-multiplication so that the net displacement along the axis 78 is in a somewhat non-linear relationship to the propagation control fields Hd and Hg. The net displacement of hard bubble domains in accordance with the embodiment just described, can provide a measure of the multiplication of the two A.C. input current signals Ig and Id.

Referring now to FIG. 3, there is illustrated a cross-sectional view of the strip layer 18 for purposes of explanation of the domain repulsive effects produced by the side edges 59 and 60. The repulsive boundaries 62 and 64 adjacent the side edges are representative of the magnetic repulsive effect on the hard bubble domain 20. It is an important aspect of this invention that repulsive boundaries extend parallel and substantially equidistant from the propagating axis 36 that extends in the plane of the neutral axis of the driving field gradient Hg. Nonlinearities in domain movement transverse to the axis 36 are somewhat balanced out or cancelled. The edges are effective to define the repulsive boundaries 62 and 64 because they each are a terminus of the magnetic material forming the layer 18. A change in the physical structure of material occurs on opposite sides of the side edges 59 and 60.

The upwardly directed arrows 115 indicate the magnetization of the layer 18 established by the D.C. bias field Hb and arrows 117 indicate the opposite magnetization of the hard bubble domain 20. The closed loop flux lines 119 and 120 occur outside the layer 18 adjacent edges 59 and 60, respectively due to the magnetization of the layer 18 and absence of the domain magnetic material beyond the side edges. These flux lines are equivalent to an externally applied repulsive field since they occur externally of the layer 18. The direction of the field flux lines is opposite to the field associated with the bubble domain 20. As the domain reaches an area of the layer 18 close to one of the edges 59 or 60 indicated by the repulsive boundaries 62 and 64 it is subject to the fields indicated by the flux lines 119 and 120. These magnetically oppose the bubble domain such that a magnetic wall formed by a repulsive force acting on the domain 20 to guide it. The repulsive boundaries help maintain the domain along an average parallel path along the axis when the driving field pushes the domain at an angle to the boundaries as indicated in FIG. 3. As noted further hereinbelow, the boundaries can be formed alternatively by a magnetic field source producing a repulsive magnetic field. The essential function of the boundaries is maintain the hard domain net displacement along the neutral axis of the field gradient Hg, in the one preferred embodiment shown in FIGS. 1 and 2.

Figure 5:
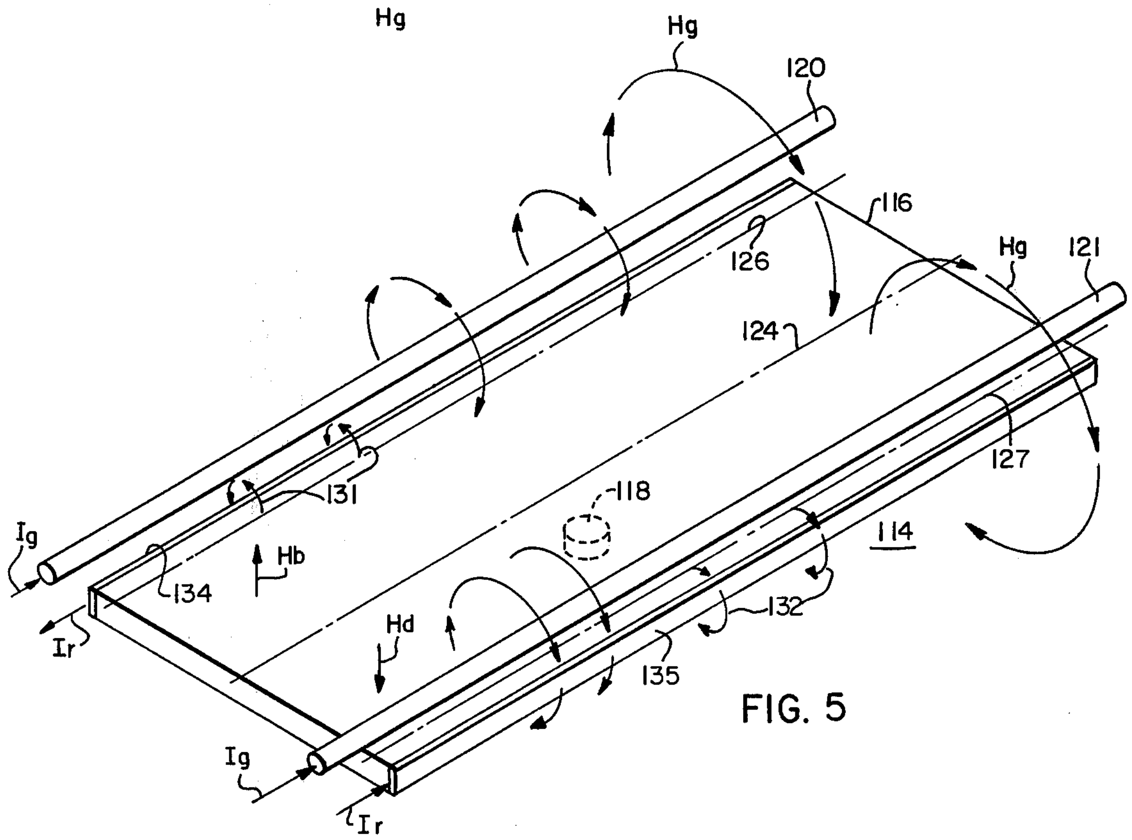
FIG. 5 is a schematic perspective view illustrating an alternative embodiment of a hard magnetic bubble domain multiplier made in accordance with this invention.

In FIG. 5 is illustrated an alternative embodiment of a hard bubble domain analog multiplier 114. A strip layer 116 of hard bubble domain magnetic material is provided corresponding to the layer 18 described above for movement of a hard bubble domain 118 therein. A D.C. bias field Hb and domain diameter control field for modulating the bias field Hb in response to the input signal Id is provided as described for the multiplier 14.

An alternative source of the driving field gradient Hg is formed by the parallel conductors 120 and 121 carrying the input current signal Ig. With the current Ig applied in the same direction relative to common end portions of the conductors as shown in FIG. 5, the portion of the gradient field Hg associated with each conductor is directed into the layer 116 on opposite sides of a center propagating axis 124. The fields cancel each other along the axis 124 so that it is also the neutral axis of the driving field gradient Hg. The slopes of the strengths increase from the axis 124 in opposite directions toward the side edges 126 and 127 at the same value and in the same manner as described for the field gradient Hg described above and shown in FIG. 2. The field Hg is cyclically varying, also as previously described, to produce net domain displacement along the neutral field axis of the gradient field as an important feature of this invention as also previously noted.

Repulsive boundaries 128 and 129 are formed at equal distance from the axis 124 to guide the orbital trajectories of the domain 118 along the axis in a channel 130. The flux lines indicated by arrows 131 and 132 define domain repulsive magnetic fields generated by current Ir flowing in the conductors 134 and 135 extending along the side edges 126 and 127, respectively. The flux lines 131 and 132 oppose the hard bubble domain 118 as it moves adjacent the boundaries 128 and 129 in an analogous manner that the flux lines 119 and 120, shown in FIG. 3, oppose the domain 20. The strength of the repulsive magnetic fields generated along the conductors 134 and 135 are related to the thickness of the layer 116, magnetization of the layer 116 and the bubble domain diameter. The hard bubble domain analog multiplier 114 can be utilized in the domain computing system 12 to perform multiplication of the A.C. current input signals Id and Ig and measurement of electrical energy flow as described in connection with the description of FIG. 1.

It is contemplated that other alternative arrangements can provide the cyclical varying domain diameter control field Hd, the driving field gradient Hg and the repulsive magnetic field for forming repulsive boundaries at predetermined spacings from an axis of net displacement of hard bubble domain propagation. In accordance with the preferred form of this invention, the net displacement axis is to coincide with the neutral axis of a driving field gradient directed into the hard domain material in opposite field directions on opposite sides of the neutral axis.

While preferred embodiments of this invention are disclosed hereinabove, it is to be understood that other embodiments may be made without departing from the spirit and scope of this invention.

We claim:

1. A hard magnetic bubble domain analog multiplier comprising:

a strip layer of hard bubble domain magnetic material capable of sustaining a hard bubble domain, said strip layer having an elongated area therein defining a bubble domain propagating channel, said channel having an axis of net displacement of bubble domain motion extending substantially parallel to opposite side boundaries of said propagating channel;

means including a bias magnetic field for maintaining at least one hard magnetic bubble domain in said propagating channel;

means producing a domain diameter control magnetic field into said strip layer so as to have an instantaneously uniform intensity throughout said domain propagating channel;

a first input current signal means responsive to a first quantity to be computed upon for cyclically varying said domain diameter control field in response to cyclic variations of the first quantity;

means producing a driving field gradient into said strip layer so as to have a gradient direction of maximum increasing intensity across said domain propagating channel so that the direction of the driving field gradient is substantially perpendicular to the net displacement axis;

a second input signal means for cyclically varying said driving field gradient in response to the cyclic variations of a second quantity to be computed upon by being multiplied by said first quantity whereby the combined cyclic variations of said domain diameter control field and said driving field gradient produce orbital domain movements having average movement along the net displacement axis of said domain propagating channel at an average velocity directly proportional to the product of said domain diameter control field and said driving field gradient thereby producing a domain net displacement proportional to the time integral of the product of said first and second quantities.

2. The hard magnetic bubble domain multiplier as claimed in claim 1 wherein said driving field gradient has a neutral axis extending along said domain propagating channel such that the field gradient has opposite field directions on opposite sides of the neutral axis.

3. The hard magnetic bubble domain analog multiplier as claimed in claim 1 wherein said strip layer has a predetermined width and wherein one of the side edges of said strip layer effects a repulsive boundary defining one of the side boundaries of the domain propagating channel.

4. The hard magnetic bubble domain analog multiplier as claimed in claim 3 wherein the neutral axis of the drying field gradient establishes the other of the side boundaries of said domain propagating channel and a net displacement axis of bubble domain movement extends parallel to said side boundaries.

5. The hard magnetic bubble domain analog multiplier as claimed in claim 2 wherein opposite side edges of said strip layer effect repulsive boundaries defining both side boundaries of the domain propagating channel wherein the bubble domain net displacement axis extends substantially equal distances from each of said side edges and is aligned with the neutral axis of said driving field gradient.

6. The hard magnetic bubble domain analog multiplier as claimed in claim 1 wherein said means producing said driving field gradient includes a ribbon layer of conductive material positioned adjacent the bottom surface said strip layer so as to be aligned with said domain propagating channel, said ribbon layer conducting said second input signal between the ends thereof with a uniform current density throughout so as to generate said driving field gradient across said domain propagating channel.

7. The hard magnetic bubble domain analog multiplier as claimed in claim 1 including a repulsive magnetic field producing means establishing at least one repulsive boundary so as to define at least one of the side boundaries of said domain propagating channel.

8. The hard magnetic bubble domain analog multiplier as claimed in claim 7 wherein said repulsive magnetic field producing means includes a conductor means positioned along the length of said side edges of said strip layer for conducting current in a predetermined direction so as to generate a repulsive magnetic field effectively establishing said repulsive boundary adjacent said one side edge.

9. The hard magnetic bubble domain analog multiplier as claimed in claim 2 wherein said means producing said driving field gradient includes a pair of conductors extending substantially parallel to each other and to said strip layer with each being equally spaced from said neutral axis.

10. A hard magnetic bubble domain computating system for computing the time integral of the product of two A.C. quantities, said system comprising:

a strip layer of hard bubble domain magnetic material having a predetermined axis of bubble domain net displacement with said axis extending between the ends of said strip layer;

means including a bias magnetic field for maintaining in said strip layer a hard bubble domain;

a first propagation control magnetic field source establishing a domain diameter control field instantaneously uniform in space and cyclically variable in time when directed into said strip layer, the level of the field variations being effective to modulate the diameter of said hard bubble domain relative to a neutral diameter established by said bias magnetic field;

a first input signal corresponding to one of said A.C. quantities and being applied to the first propagation control field source for modulating the level of said domain diameter control field in direct response to the magnitude and variations of said one A.C. quantity;

a second propagation control field source establishing a driving field gradient in said strip layer having the direction of said field gradient extending substantially perpendicular to said predetermined axis of bubble domain net displacement, said driving field gradient being instantaneously uniform along paths parallel to the axis of the bubble domain net displacement axis and having a gradient direction of increasing field strength perpendicular to the predetermined axis, said driving field gradient further being cyclically variable in time so as to cooperatively act with said domain diameter control field to propagate said hard bubble domain through orbital movements having a net computating displacement along the predetermined axis at an average velocity responsive to the product of the magnetic fields generated by said first and said second propagation control fields sources;

a second input signal corresponding to the other of said two A.C. quantities being applied to said second propagation control field source for varying said driving field gradient in direct response to the magnitude and variations of said other A.C. quantity;

bubble domain detector means positioned along the axis of net displacement so as to initiate signals responsive to magnetic bubble domains travelling a predetermined net displacement distance in response to the combined driving effects of said first and second propagation control field sources; and output circuit means responsive to the signals initiated by said bubble domain detector means for producing an output corresponding to the computed time integral of the product of said two A.C. quantities.

11. The system as claimed in claim 10 wherein said strip layer of hard bubble domain magnetic material includes repulsive boundaries extending parallel to the predetermined axis of bubble domain net displacement so as to define a propagating channel restricting the lateral orbital movements of the bubble domain, and further wherein said driving field gradient has a neutral axis aligned with said predetermined axis of bubble domain net displacement.

12. The system as claimed in claim 11 wherein said strip layer of hard bubble domain magnetic material has a predetermined width and the system further includes a ribbon layer of uniform current carrying material, said ribbon layer being positioned parallel to and immediately adjacent one surface of the strip layer for conducting a uniformly distributed current in response to said second input signal for generating the driving field gradient.

13. The system as claimed in claim 10 wherein said bubble domain detector means includes two detectors and said system includes a phase reverser circuit effective to reverse the phase of one of the first and second input signals upon a bubble domain reaching said detector means so as to reverse the direction of net displacement of the hard bubble domain.

* * * * *